United States Patent
Liu et al.

(10) Patent No.: US 7,209,363 B2
(45) Date of Patent: Apr. 24, 2007

(54) LATCHING ASSEMBLY FOR A REMOVABLE PANEL OF A PORTABLE ELECTRONIC DEVICE

(75) Inventors: Ji Kun Liu, Shindian (TW); Qing Ming Huang, Shenzhen (CN); Chia-Hua Chen, Shindian (TW)

(73) Assignees: Shenzhen Futaihong Precision Ind. Co., Ltd., Shenzhen (CN); Sutech Trading Limited, Tortola (VG)

( * ) Notice: Subject to any disclaimer, the term of this patent is extended or adjusted under 35 U.S.C. 154(b) by 255 days.

(21) Appl. No.: 10/921,406

(22) Filed: Aug. 18, 2004

(65) Prior Publication Data
US 2005/0141210 A1   Jun. 30, 2005

(30) Foreign Application Priority Data
Dec. 26, 2003 (TW) ............................ 92222772 U

(51) Int. Cl.
*H05K 7/14* (2006.01)
(52) U.S. Cl. ..................................... 361/801
(58) Field of Classification Search ........... 361/801, 361/802, 759; 379/433.13
See application file for complete search history.

(56) References Cited

U.S. PATENT DOCUMENTS

| | | | | | |
|---|---|---|---|---|---|
| 5,848,152 | A | * | 12/1998 | Slipy et al. | 379/433.13 |
| 5,982,881 | A | * | 11/1999 | Mischenko | 379/433.11 |
| 2002/0002059 | A1 | * | 1/2002 | Johnson | 455/550 |
| 2004/0266498 | A1 | * | 12/2004 | Qin et al. | 455/575.1 |
| 2005/0009588 | A1 | * | 1/2005 | Qin et al. | 455/575.8 |
| 2005/0037717 | A1 | * | 2/2005 | Oin et al. | 455/90.3 |

* cited by examiner

*Primary Examiner*—Tuan Dinh
*Assistant Examiner*—Abiy Getachew
(74) *Attorney, Agent, or Firm*—Wei Te Chung

(57) ABSTRACT

A portable electronic device includes a removable panel (12), a latch assembly (20), and a base cover (30). The removable panel defines a first latch hole (1214). The base cover defines a third latch hole (344) corresponding to the first latch hole. The latch assembly includes a knob (21). The knob includes an operating portion (212), a shaft portion (214) extending downwardly from the operating portion, and a latching portion (216) extending from one end of the shaft portion. The latching portion is received through the first latch hole and the third latch hole. When the operating portion of the knob is pressed and rotated, the removable panel is secured to the base cover via the operating portion and the latching portion.

24 Claims, 5 Drawing Sheets

20 US 7,209,363 B2

LATCHING ASSEMBLY FOR A REMOVABLE PANEL OF A PORTABLE ELECTRONIC DEVICE

BACKGROUND OF THE INVENTION

1. Field of the Invention

The present invention generally relates to portable electronic devices having removable panels, and more particularly to a latching assembly for detachably securing a removable panel to a portable electronic device. The instant invention relates to a contemporarily filed application titled "LATCHING ASSEMBLY FOR A REMOVABABLE COVER OF A WIRELESS COMMUNICATION DEVICE" and having the same assignee with the instant application.

2. Prior Art

Nowadays, portable electronic devices such as mobile phones and PDAs (personal digital assistants) are in widespread use around the world. There is more and more demand for higher quality and serviceability of these portable electronic devices. Many portable electronic devices are provided with removable panels which can be changed over for new, more aesthetically pleasing panels when so desired by users.

Removable panels are most commonly provided for mobile phones. A user may from time to time want to remove an old panel from a base cover of the mobile phone, and install a new fashionable panel on the base cover instead. The new panel must be attached firmly and securely.

Currently, removable panels of portable electronic devices are commonly fixed on the base covers by means of structures integrated with the panels themselves. An example is the removable panel of the mobile phone model No. OT310 marketed by ALCATEL CORPORATION. A top of the removable panel is bent to define a holding portion, and a hook protrudes from an inner surface of the holding portion. The removable panel has a peripheral flange. A bottom of the removable panel has two projections, and opposite sides of the removable panel have a plurality of detents. The projections and the detents protrude from the flange. Corresponding to the structure of the removable panel, the base cover has an engaging surface, and defines a notch, two grooves and a plurality of slots. The notch is located at a top of the engaging surface. The grooves are located at a bottom of the engaging surface. The slots are located at two opposite sides of the engaging surface. In assembly, the projections are firstly inserted into the grooves and retained therein. The hook is then inserted into the notch, with the detents being received in the slots. The hook is firmly engaged in the notch, and the detents are securely engaged in the slots. Thus the removable panel is firmly fixed to the base cover. In disassembly, the hook is first disengaged from the notch, with the detents being removed from the slots. The projections are then pulled out from the grooves. The removable panel is thus fully detached from the base cover.

It is important for the removable panel to not only be firmly retained in the base cover, but also to be easily removed when needed. Generally, a good deal of force needs to be exerted on the removable panel for it to be detached. The removable panel is easily damaged if excessive force is applied, both in the process of detaching the removable panel and in attaching the removable panel.

A new latching assembly for a removable panel of a portable electronic device is desired in order to overcome the above-described problems.

SUMMARY OF THE INVENTION

Accordingly, an object of the present invention is to provide a latching assembly for a removable panel of a portable electronic device. In particular, what is intended to be provided is a latching assembly which has a relatively simple configuration, which can firmly attach the removable panel to a base cover of the portable electronic device, and which can allow easy detachment of the removable panel from the base cover.

To achieve the above-mentioned object, a portable electronic device of the present invention includes a removable panel, a latch assembly, and a base cover. The removable panel defines a first latch hole therein. The base cover defines a third latch hole therein, corresponding to the first latch hole. The latch assembly comprises a knob. The knob comprises an operating portion, a shaft portion extending downwardly from the operating portion, and a latching portion. The latching portion extends from an end of the shaft portion, and is received through the first latch hole and the third latch hole. The shaft portion of the knob is received in the first latch hole and third latch hole. When the operating portion is pressed and rotated, the removable panel is secured to the base cover via the operating portion and the latching portion.

Other objects, advantages and novel features of the invention will become more apparent from the following detailed description when taken in conjunction with the accompanying drawings, in which:

DETAILED DESCRIPTION OF THE INVENTION

Figure 1:
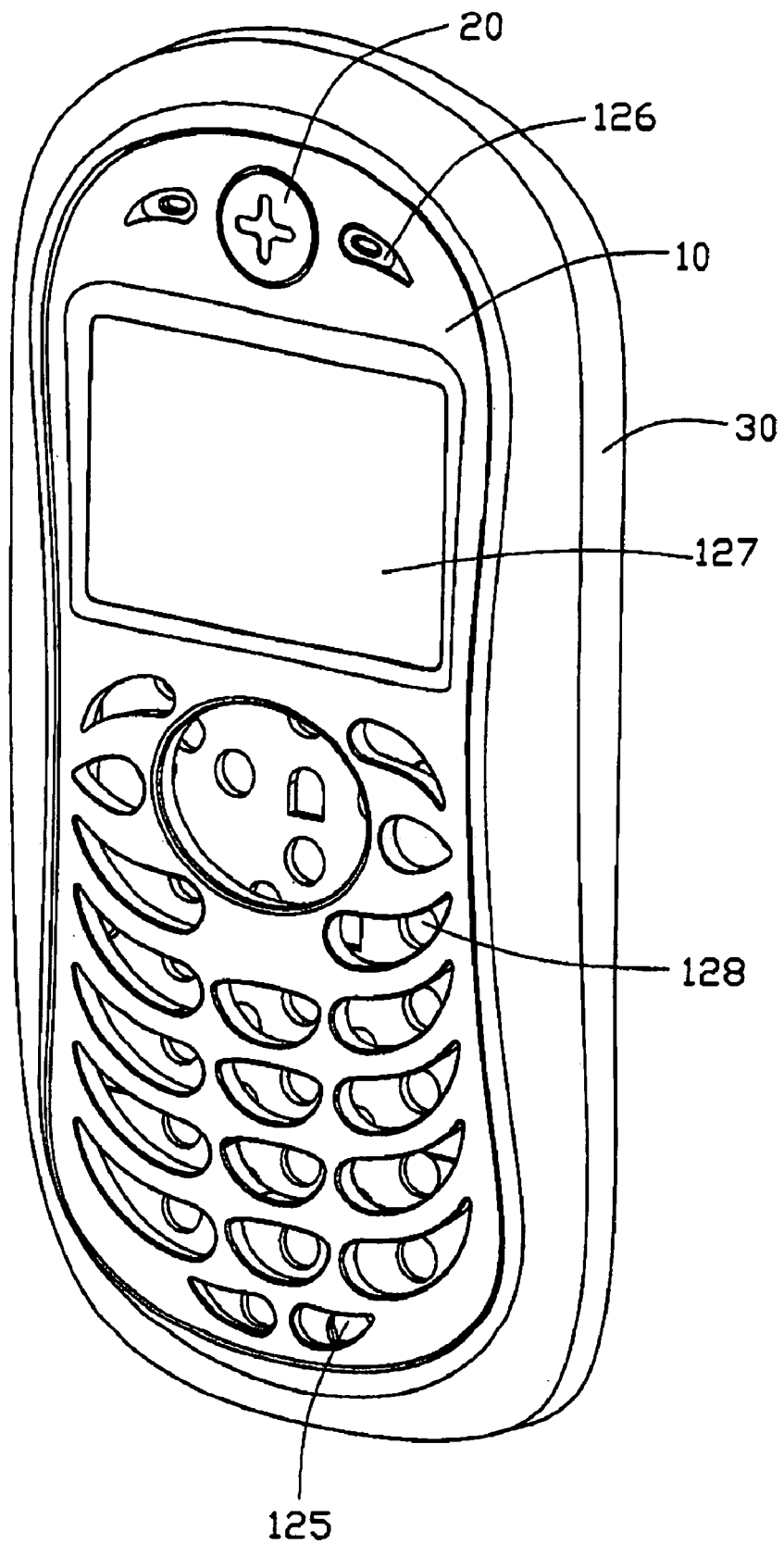
FIG. 1 is an isometric view of part of a portable electronic device incorporating a removable panel, a base cover, and a latching assembly in accordance with a preferred embodiment of the present invention.

A portable electronic device of the present invention is generally shown in FIG. 1 to be a radiotelephone, preferably a cellular telephone operable in a cellular telephone system. Although the radiotelephone is provided as an exemplary embodiment, one skilled in the art will recognize that the features discussed hereinbelow will also find application in other portable electronic devices such as cordless telephones, wireline telephones, personal digital assistants ("PDAs"), two-way radios, pagers, and the like. Therefore, the radiotelephone as described herein shall be construed to include and refer to each and any of these portable electronic devices and their equivalents.

Referring to FIG. 1, the radiotelephone (not labeled) includes a panel assembly 10, a latching assembly 20, and a base cover 30. The panel assembly 10 is inserted in the base cover 30 and firmly retained therein by way of the latching assembly 20. It is to be understood that the position of the latching assembly 20 can be varied to any other suitable location on the radiotelephone or on a portable electronic device.

Figure 2:
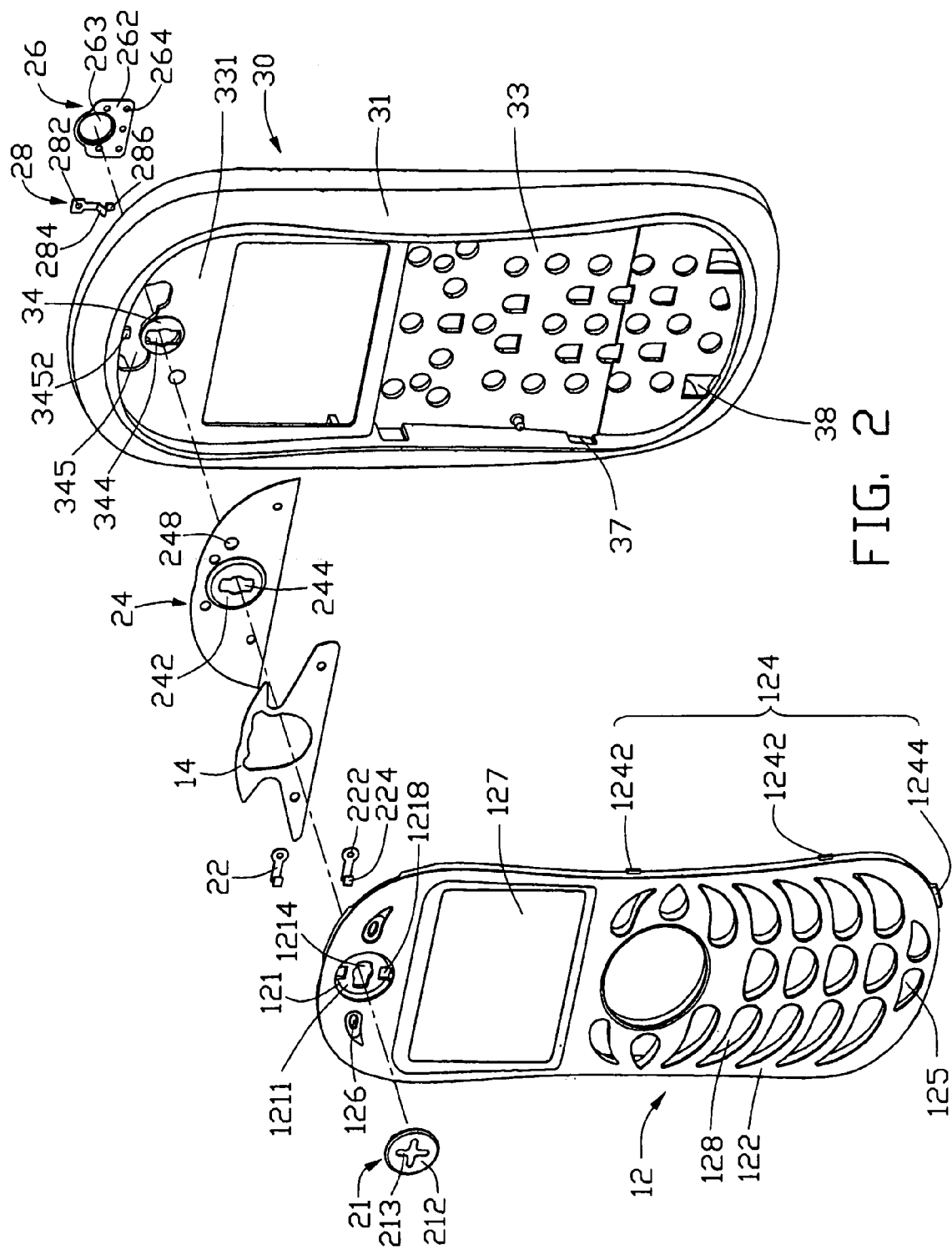
FIG. 2 is an exploded view of FIG. 1.
Figure 3:
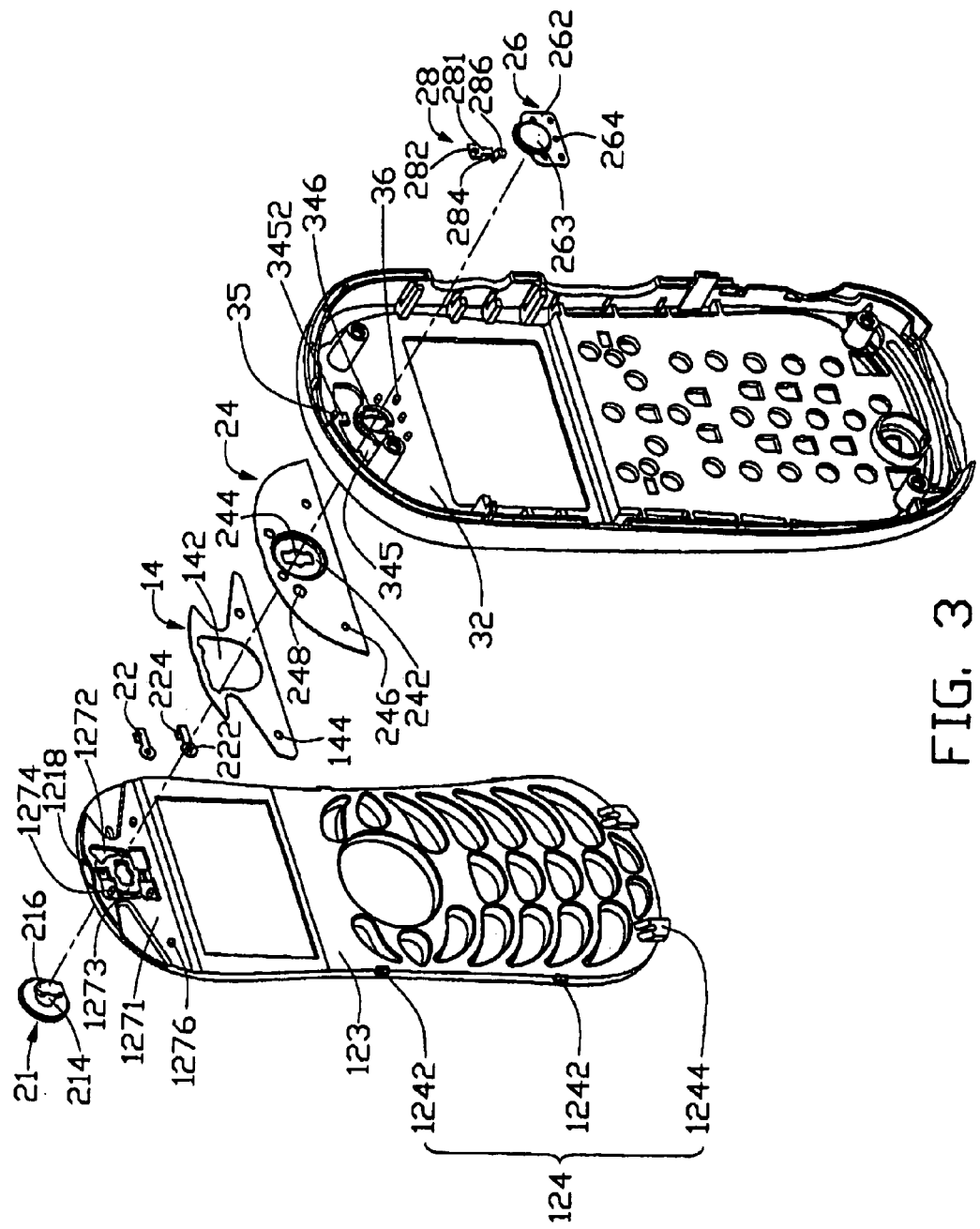
FIG. 3 is similar to FIG. 2, but viewed from another aspect.

Referring also to FIG. 2 and FIG. 3, the panel assembly 10 comprises a removable panel 12 and a shielding plate 14. The removable panel 12 comprises a mounting portion 121 located in a first end portion thereof, an upper surface 122, a lower surface 123, and a plurality of detents 124 protruding from a peripheral edge portion thereof. The removable panel 12 further defines a plurality of microphone apertures 125 located in a second end portion thereof, a plurality of speaker apertures 126 adjacent the mounting portion 121, a display window 127 adjacent the microphone apertures 125, and a plurality of keyholes 128 between the display window 127 and the microphone apertures 125. The shielding plate 14 is attached to the removable panel 12 and shields electronic magnetic interference ("EMI").

The mounting portion 121 comprises a circular recess 1211 defined in the upper surface 122, a generally rectangular first latch hole 1214 defined at a bottom of the circular recess 1211, and two opposing holes 1218 respectively defined at a peripheral edge of the circular recess 1211. The first latch hole 1214 is bounded by two opposing arcuate walls. A concave portion 1271 is formed on the lower surface 123 of the removable panel 12 corresponding to the shielding plate 14, and a depression portion 1272 is formed in the concave portion 1271 adjoining the mounting portion 121. A plurality of protruding portions 1273 surrounding the first latch hole 1214 is formed in the depression portion 1272. The protruding portions 1273 extend lower than the concave portion 1271. Two first positioning pins 1274 protrude from one side of the depression portion 1272 adjacent the holes 1218, and two second positioning pins 1276 protrude from the concave portion 1271 near respective opposing edges of the removable panel 12. The second positioning pins 1276 can secure the shielding plate 14 to the latching assembly 20. The shielding plate 14 defines a hole 142 corresponding to the depression portion 1272, and two first positioning holes 144 which receive the second positioning pins 1276.

The detents 124 include a pair of catches 1242 located on each of opposite long sides of the removable panel 12, and two latches 1244 extending from a second end of the removable panel 12.

The latch assembly 20 comprises a knob 21, two first spring members 22, a locking plate 24, a positioning plate 26, and a second spring member 28. The knob 21, the first spring members 22 and the locking plate 24 are attached to the removable panel 12. The positioning plate 26 and the second spring member 28 are attached to the base cover 30. The knob 21 comprises an operating portion 212, a shaft portion 214, and a latching portion 216. The operating portion 212 defines a cross-shaped groove 213 in an uppermost part thereof, for facilitating operation thereof. The shaft portion 214 is cylindrical, and extends downwardly from the operating portion 212. The latching portion 216 extends from a distal end of the shaft portion 214, and corresponds to the first latch hole 1214. Each first spring member 22 comprises a second positioning hole 222 located in a first end portion thereof, and an elastic portion 224 located at a second end portion thereof. The second positioning holes 222 of the first spring members 22 receive the first positioning pins 1274. Each elastic portion 224 is formed by bending the second end portion of the first spring member 22 into a "V" shape. The first spring members 22 are metallic, so that the elastic portion 224 can be compressed and decompressed again and again. The configuration of the locking plate 24 corresponds with that of the concave portion 1271. The locking plate 24 comprises a protruding portion 242 corresponding to the mounting portion 121, a second latch hole 244 defined in the protruding portion 242 and being oriented perpendicular to the first latch hole 1214, and a pair of third positioning holes 246 corresponding to the second positioning pins 1276. The locking plate 24 also defines a plurality of acoustic holes 248. The positioning plate 26 comprises a positioning portion 262, and a circular restricting portion 263 offset from the positioning portion 262. The positioning portion 262 defines a plurality of fourth positioning holes 264 therethrough, for securing the positioning plate 26 to the base cover 30. The second spring member 28 comprises a main body 281, a fifth positioning hole 282 located in a first end portion thereof, and an elastic portion 284 located at a second end portion thereof. The elastic portion 284 is "V" shaped, and a securing portion 286 is formed at a free end of the elastic portion 284.

The base cover 30 includes a peripheral sidewall 31, a bottom wall 33, and a lower surface 32. The sidewall 31 and the bottom wall 33 cooperatively form a shallow compartment 331 in an upper portion of the base cover 30. A protruding portion 34 is formed on a first end portion of the bottom wall 33, corresponding to and being slightly smaller than the protruding portion 242. A third latch hole 344 is defined in the protruding portion 34, corresponding to the second latch hole 244. An access hole 345 is defined in the bottom wall 33 immediately above the protruding portion 34, so that the speaker apertures 126 can freely receive sound from the cellular telephone. A resisting plate 3452 extends inwardly from an upper sidewall that bounds the access hole 345, for positioning the second spring member 28. Two arcuate recesses 346 (best seen in FIG. 5) are symmetrically defined at respective opposite sides of the third latch hole 344, for receipt of the latching portion 216 thereat. A third positioning pin 35 is located on the lower surface 32 above the resisting plate 3452, corresponding to the fifth positioning hole 282 of the second spring member 28. A plurality of fourth positioning pins 36 is located on the lower surface 32 below the third latch hole 344, corresponding to the fourth positioning holes 264 of the positioning plate 26. A pair of catch slots 37 is defined in each of opposite long side portions of the sidewall 31, corresponding to the catches 1242 of the removable panel 12. Two latching slots 38 are defined in a second end portion of the bottom wall 32, corresponding to the latches 1244 of the removable panel 12. It is to be understood that the number of latches 1244 and the number of latching slots 38 can be varied according to need.

Figure 4:
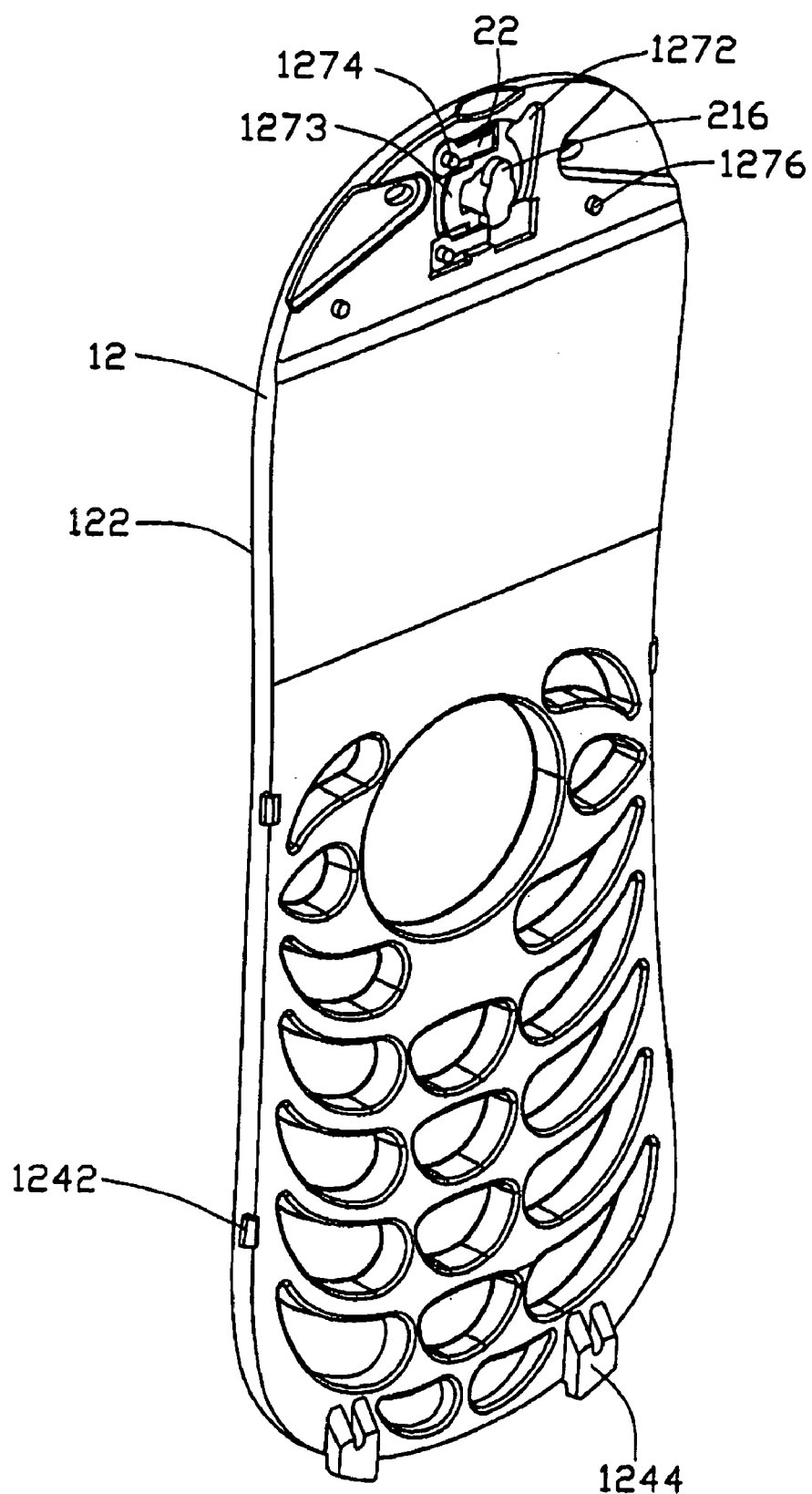
FIG. 4 is an enlarged, assembled view of the removable panel and part of the latching assembly shown in FIG. 3.

Referring to FIG. 4, in assembly, firstly, parts of the latching assembly 20 are attached in the panel assembly 10. The second positioning holes 222 of the first spring members 22 receive the first positioning pins 1274 of the removable panel 12, with the elastic portions 224 extending through the holes 1218 and protruding from the upper surface 122 of the removable panel 12. The first positioning holes 144 of the shielding plate 14 receive the second positioning pins 1276 of the removable panel 12. The latching portion 216 of the knob 21 is adjusted so that it is received through the first latch hole 1214, with the operating portion 212 protruding from the upper surface 122 of the removable panel 12. Then the knob 21 is rotated about 90 degrees to a vertical orientation so that the latching portion 216 is received through the second latch hole 244 of the locking plate 24. The locking plate 24 is engaged around the shaft portion 214, with the second positioning pins 1276 being received in the third positioning holes 246. The first positioning pins 1274 and the second positioning pins 1276 are heated and deformed in order to secure the shielding plate 14, the knob 21, the first spring members 22 and the locking plate 24 onto the removable panel 12.

Figure 5:
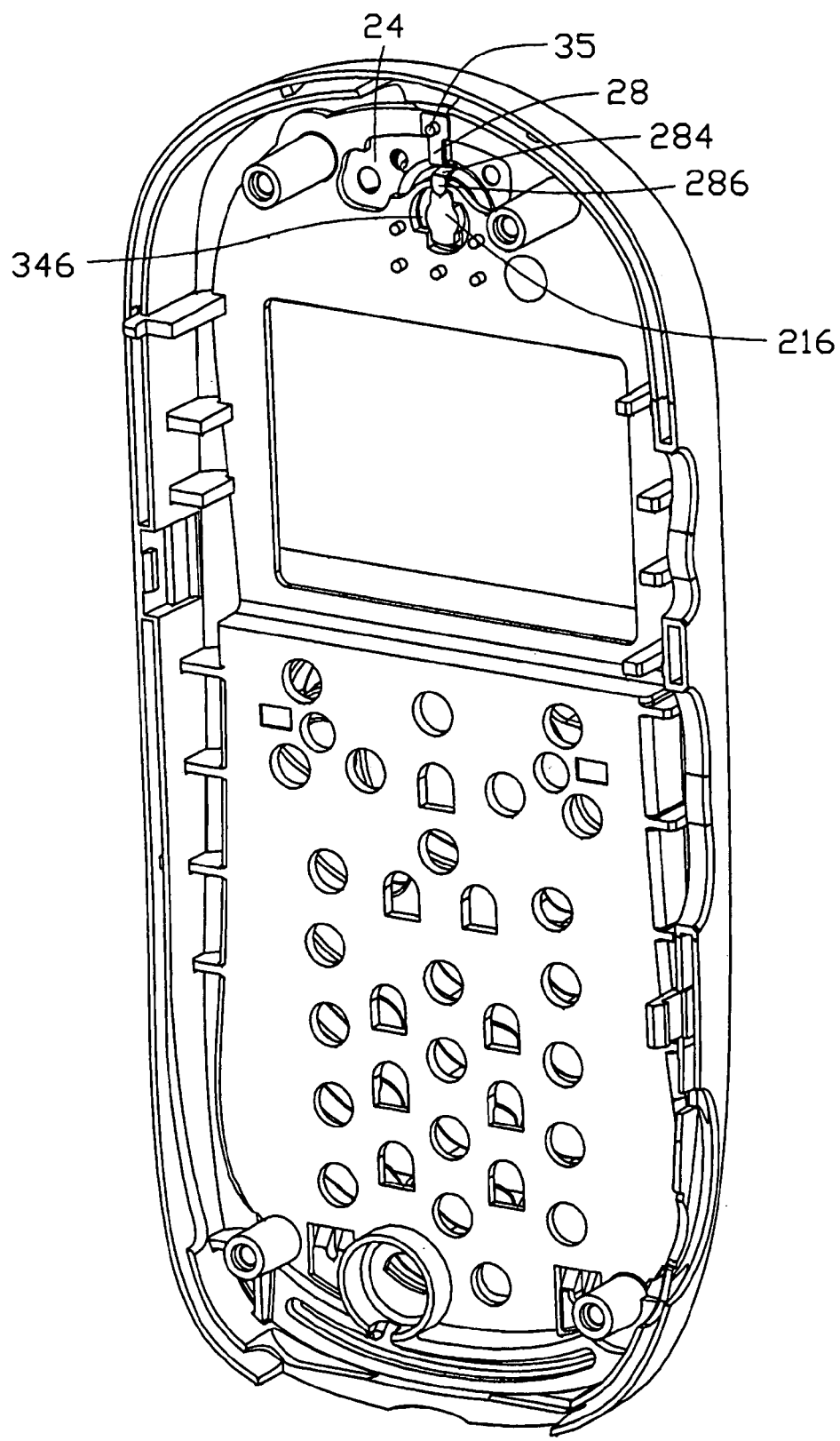
FIG. 5 is similar to FIG. 1, but viewed from a reverse aspect and not showing a positioning plate of the latching assembly.

Referring also to FIG. 5, secondly, the other parts of the latching assembly 20 are attached to the base cover 30. The fifth positioning hole 282 of the second spring member 28 receives the third positioning pin 35 of the base cover 30. The main body 281 of the second spring member 28 abuts a bottom of the resisting plate 3452, with the elastic portion 284 extending through the access hole 345 and protruding up from the bottom wall 33 of the base cover 30, and the securing portion 286 abutting the bottom surface 32 of the base cover 30. The fourth positioning holes 264 of the positioning plate 26 receive the fourth positioning pins 36 of the base cover 30. A top peripheral edge of the restricting portion 263 presses the securing portion 286 of the second spring member 28 so that the securing portion 286 is positioned between the base cover 30 and the positioning plate 26, which improves the stability of the second spring member 28. Then, the third positioning pin 35 and the fourth positioning pins 36 are heated and deformed in order to secure the second spring member 28 and the positioning plate 26 to the base cover 30.

Thirdly, the combined panel assembly 10 is attached to the combined base cover 30. The latches 1244 of the removable panel 12 are inserted into the latching slots 38 of the base cover 30. The catches 1242 are received in the catch slots 37. At this time, the mounting portion 121 of the removable panel 12 is positioned upon the protruding portion 34 of the base cover 30, and the combined panel assembly 10 is substantially received in the compartment 331 of the base cover 30. At the same time, the elastic portion 284 of the second spring member 28 abuts the protruding portion 242 of the locking plate 24. The removable panel 12 is pressed down so that the latches 1244 engage in the latching slots 38. The latching portion 216 of the knob 21 is received through the third latch hole 344 and located between the arcuate recesses 346 of the base cover 30. The knob 21 is pressed down and rotated about 90 degrees, so that the latching portion 216 reaches a transverse orientation engaged in the arcuate recesses 346 and the knob 21 engages in the mounting portion 121. At the same time, the elastic portions 224 of the first spring members 22 and the elastic portion 284 of the second spring member 28 are elastically compressed. Thus the removable panel 12 is engaged in the compartment 331, with the operating portion 212 and the latching portion 216 of the knob 21 securing the removable panel 12 to the base cover 30.

In detaching the panel assembly 10 from the base cover 30, the process is substantially the reverse of the above-described assembly process. The knob 21 is pressed down and rotated about 90 degrees so that the latching portion 216 reaches the vertical orientation. At the same time, the elastic portions 224 of the first spring members 22 decompress and push upwardly against the operating portion 212 of the knob 21, and the elastic portion 284 of the second spring member 28 decompressed and pushes upwardly against the protruding portion 242 of the locking plate 24. Thus the removable panel 12 is displaced upwardly. Then the knob 21 can be gripped in order to take the removable panel 12 out from the compartment 331. Further or alternatively, the radiotelephone can be inverted in order to take the removable panel 12 out from the compartment 331. The catches 1242 of the removable panel 12 are released from the catch slots 37, and the latches 1244 of the removable panel 12 are released the latching slots 38.

In further alternative embodiments, the shielding plate 14, the locking plate 24 and the second spring members 28 can be omitted. The parts of the latch assembly 20 can be attached to the removable panel 12 and the base cover 30 by other means such as using adhesive. Thus, the positioning pins 1274, 1276, 35, 36 and the positioning holes 144, 222, 246, 264, 282 can be omitted.

From the above description, it will be apparent that the latching assembly 20 of the present invention provides convenient attachment and detachment of the removable panel 12 to and from the base cover 30.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A portable electronic device, comprising:
    a removable panel defining a first latch hole;
    a base cover defining a third latch hole corresponding to the first latch hole; and
    a latch assembly comprising a knob, a first spring member, and a second spring member, the first spring member being secured to a lower surface of the removable panel facing the base cover, the second spring member being secured to the base cover, the knob comprising an operating portion, a shaft portion extending from the operating portion, and a latching portion extending from the shaft portion and spaced apart from the operating portion, the latching portion received through the first latch hole and the third latch hole;
    wherein the knob detachably attaches the removable panel to the base cover by selectably one of compression and decompression of the first spring member and the second spring member, the decompression of the first spring member urging the knob from the removable panel, the decompression of the second spring member urging the removable panel away from the base cover.

2. The portable electronic device as claimed in claim 1, wherein the elastic portion is formed by bending said end of said first spring member into a "V" shape.

3. The portable electronic device as claimed in claim 1, wherein the first latch hole is oriented perpendicular to the third latch hole.

4. The portable electronic device as claimed in claim 1, wherein the base cover defines two recesses in a lower surface thereof and disposed at opposite sides of the third latch hole, for receiving the latching portion of the knob.

5. The portable electronic device as claimed in claim 1, wherein the latch assembly further comprises a positioning plate attached to a lower surface of the base cover, and the positioning plate includes a restricting portion and a positioning portion, and the restricting portion is offset from the positioning portion.

6. The portable electronic device as claimed in claim 1, wherein a plurality of catches is located on opposite sides of the removable panel, and the base cover defines a plurality of catch slots corresponding to the catches.

7. The portable electronic device as claimed in claim 1, wherein a plurality of latches is provided on the removable panel, and the base cover defines a plurality of latching slots corresponding to the latches.

8. The portable electronic device as claimed in claim 1, further comprising a shielding plate attached to the removable panel, the shielding plate defining a hole for exposing the first spring member and the mounting portion.

9. The portable electronic device as claimed in claim 1, wherein the base cover defines two recesses in a lower surface thereof and disposed at opposite sides of the third latch hole, for receiving the latching portion of the knob.

10. The portable electronic device as claimed in claim 1, wherein the removable panel has a panel hole adjacent to the first latch hole, the first spring member has an elastic portion at one end thereof, the elastic portion extending through the panel hole and protruding from an upper surface of the removable panel.

11. The portable electronic device as claimed in claim 10, wherein a mounting portion is defined at a periphery of the first latch hole, and is engaged with the operating portion of the knob.

12. The portable electronic device as claimed in claim 11, wherein the mounting portion comprises a recess defined at the upper surface of the removable panel, the panel hole being defined at a periphery of the recess.

13. The portable electronic device as claimed in claim 1, wherein the latch assembly further comprises a locking plate which is attached to a lower surface of the removable panel.

14. The portable electronic device as claimed in claim 13, wherein the locking plate defines a second latch hole oriented perpendicular to the first latch hole, and the locking plate is engaged around the shaft portion of the knob.

15. The portable electronic device as claimed in claim 14, wherein the locking plate comprises a protruding portion protruding from a first surface of the locking plate, the first surface of the locking plate facing the removable panel.

16. The portable electronic device as claimed in claim 15, wherein the base cover comprises a protruding portion slightly smaller than and engaged with the protruding portion of the locking plate.

17. The portable electronic device as claimed in claim 16, wherein the second spring member has an elastic portion at one end thereof, and the base cover defines an access hole, the elastic portion of the second spring member extending through the access hole and protruding from an upper surface of the base cover to abut the protruding portion of the locking plate.

18. A portable electronic device, comprising:
a removable panel defining a first latch hole;
a base cover defining a third latch hole;
a latch assembly moveable relative to both the removable panel and the base cover, the latch assembly comprising a knob, the knob comprising an operating portion, a shaft portion extending from the operating portion, and a latching portion extending from a distal end of the shaft portion and received through both the first latch hole and the third latch hole;
wherein the third latch hole is dimensioned and configured to comply with the latching portion so as to allow the latching portion to extend therethrough, while the base cover latchably abuts against the latching portion once said latching portion extends through the third latch hole and rotates about an angle to have the latching portion no longer aligned with the third latch hole.

19. The portable electronic device as claimed in claim 18, wherein the second biasing device is a second spring member secured to a lower surface of the base cover.

20. The portable electronic device as claimed in claim 19, wherein the second spring member has an elastic portion at one end thereof, and the base cover defines an access hole, the elastic portion of the second spring member extending through the access hole and protruding from an upper surface of the base cover to abut the protruding portion of the locking plate.

21. The portable electronic device as claimed in claim 18, wherein the latching assembly further includes a first biasing device to urge the panel away from the base cover, and a second biasing device to urge the latching assembly away from the panel.

22. The portable electronic device as claimed in claim 21, wherein the first biasing device comprises at least one first spring member secured to a lower surface of removable panel facing the base cover.

23. The portable electronic device as claimed in claim 22, wherein the removable panel has at least one panel hole therein adjacent to the first latch hole, the at least one spring member having an elastic portion at one end thereof, the elastic portion extending through the at least one hole and protruding from an upper surface of the removable panel.

24. The portable electronic device as claimed in claim 23, wherein the elastic portion is formed by bending said end of said first spring member into a "V" shape.

* * * * *